United States Patent [19]
Ishida et al.

[11] Patent Number: 4,915,979
[45] Date of Patent: Apr. 10, 1990

[54] SEMICONDUCTOR WAFER TREATING DEVICE UTILIZING ECR PLASMA

[75] Inventors: Tomoaki Ishida; Nobuo Fujiwara; Kyusaku Nishioka; Moriaki Akazawa; Teruo Shibano; Kenji Kawai, all of Itami, Japan

[73] Assignee: Mitsubishi Denki Kabushiki Kaisha, Japan

[21] Appl. No.: 279,016

[22] Filed: Dec. 2, 1988

[30] Foreign Application Priority Data

Jul. 5, 1988 [JP] Japan ................... 63-165812

[51] Int. Cl.$^4$ ............................................. C23C 16/50
[52] U.S. Cl. ......................................... 427/39; 427/38; 427/47; 118/723; 156/345; 156/646; 156/654; 156/657
[58] Field of Search ................ 118/723; 156/345, 646, 156/654, 657; 427/38, 39, 47

[56] References Cited

U.S. PATENT DOCUMENTS

| | | | |
|---|---|---|---|
| 4,401,054 | 8/1983 | Matsuo | 427/47 |
| 4,461,783 | 7/1984 | Yamazaki | 427/39 |
| 4,808,258 | 2/1989 | Otsubo | 156/345 |

FOREIGN PATENT DOCUMENTS 56-15535 12/1981 Japan .

OTHER PUBLICATIONS

Bruce, "Anisotropy Control in Dry Etching", Solid State Technology/Oct. 1981, pp. 64-68.

Primary Examiner—Richard Bueker
Attorney, Agent, or Firm—Leydig, Voit & Mayer

[57] ABSTRACT

A semiconductor wafer treating device utilizing a gas plasma generated by electron cyclotron resonance (ECR) is disclosed whch comprises a wafer treating chamber and a plasma generating chamber communicating with the wafer treating chamber. Microwave energy at a frequency of not more than 2 GHz and not less than 100 MHz is supplied to the plasma generating chamber which is surrounded by a solenoidal coil and produces a magnetic field in the plasma generating chamber and in the wafer treating chamber to produce ECR and transport the plasma generated by ECR to the wafer. Thus, the Larmor radius of the electrons moving in helical paths in electron cyclotron resonance in the plasma generating chamber is optimized to make the plasma spatially uniform. Consequently, the uniformity of the treatment on the wafer is improved.

6 Claims, 2 Drawing Sheets

SEMICONDUCTOR WAFER TREATING DEVICE UTILIZING ECR PLASMA

BACKGROUND OF THE INVENTION

1. Field of the Invention

The present invention relates to devices for treating semiconductor wafers utilizing a plasma generated by electron cyclotron resonance.

2. Description of the Prior Art

In the production of semiconductor devices such as transistors and integrated circuits, semiconductor substrates or wafers are subjected to treatments, such as thin film formation, etching, oxidation, and doping. Recently, wafer treating devices utilizing a plasma generated by electron cyclotron resonance (ECR) have been developed, which have a number of advantages over conventional chemical vapor deposition devices, including low operating temperature and high treatment quality.

Japanese patent laid-open No. 56-155535 and U.S. patent application Ser. No. 315,730 teach a fundamental structure of such semiconductor wafer treating devices utilizing a plasma generated by electron cyclotron resonance. These ECR plasma wafer treating devices generally comprise a wafer treating chamber and a plasma generating chamber adjacent to the wafer treating chamber. Microwave energy having a frequency of 2.45 GHz generated by a microwave source is introduced into the plasma generating chamber through a waveguide. A solenoidal electromagnetic coil surrounding the plasma generating chamber generates a magnetic field of a flux density which corresponds to the microwave frequency so that electron cyclotron resonance is produced in the plasma generating chamber. Thus, absorbing the microwave energy, electrons in the plasma generating chamber are accelerated in a helical path. The collisions of these fast moving electrons generate the plasma of a gas in the plasma generating chamber, which is conveyed to the semiconductor wafer along the diverging lines of magnetic field produced by the solenoidal coil in the wafer treating chamber. In this manner, the treatment of the wafer, e.g. thin film formation or etching on the surface thereof, is effected. What kind of gas is utilized in the process, how great the gas pressure, and the level of the power of the microwave source, etc., are determined according to the type of treatment which is effected on the wafer.

The conventional ECR plasma wafer treating devices, however, have disadvantages as described in what follows. The above mentioned devices utilize microwave energy at the frequency of 2.45 GHz, the flux density of the magnetic field formed in the plasma generating chamber being regulated to 875 G to produce electron cyclotron resonance in cooperation with the microwaves. The Larmor radius of helically moving electrons, i.e. the radius of curvature of the projection of the helical paths of the electrons on a plane perpendicular to the direction of the magnetic field, depends on such factors as electron temperature and gas condition. However, the radius is proportional to the velocity of the electrons and inversely proportional to the cyclotron frequency:

Larmor radius of electrons = velocity of electrons/cyclotron frequency

Thus, assuming that the microwave frequency is 2.45 GHz and that the electron temperature is 100,000 K, the Larmor radius of electrons moving in helical paths in the plasma generating chamber in electron cyclotron resonance is about 0.1 mm. This Larmor radius of electrons is extremely small compared with the Larmor radius of electrons is extremely small compared with the radii of semiconductor wafers and of the plasma generating chamber, which are usually greater than 1 cm. Thus, the density of the plasma tends to be spatially uneven in the plasma generating chamber. As a result, the amount of the reactive ions reaching the surface of the semiconductor wafer in the wafer treating chamber also become uneven, thereby impairing the uniformity of the semiconductor wafer treatment.

SUMMARY OF THE INVENTION

Thus, an object of the invention is to provide a semiconductor wafer treating device utilizing a plasma generated by electron cyclotron, resonance, wherein the uniformity of the treatment of the wafer surface is improved.

A further object of the present invention is to provide such a wafer treating device which is simple and inexpensive.

In the device according to the present invention, the frequency of the microwaves supplied to the plasma generating chamber is not more than 2 GHz and not less than 100 MHz; thus, a large value of the Larmor radius of electrons moving in the plasma generating chamber in electron cyclotron resonance is realized in a practically feasible range. Thus, the density of the plasma in the plasma generating chamber becomes uniform and the uniformity of the surface treatment in the wafer treatment process is improved.

The uniformity of the treatment can be further improved by increasing the Larmor radius provided that it is compatible with the dimensions of the device and the wafer. Thus, it is preferred that the frequency of the microwave supplied to the plasma generating chamber be not more than 1.0 GHz; it is further preferred that it is not more than 0.5 GHz.

BRIEF DESCRIPTION OF THE DRAWINGS

Further details and features of the present invention will become clear in the following detailed description of the preferred embodiments taken in conjunction with the accompanying drawings, in which.

DETAILED DESCRIPTION OF THE PREFERRED EMBODIMENTS

Figure 1:
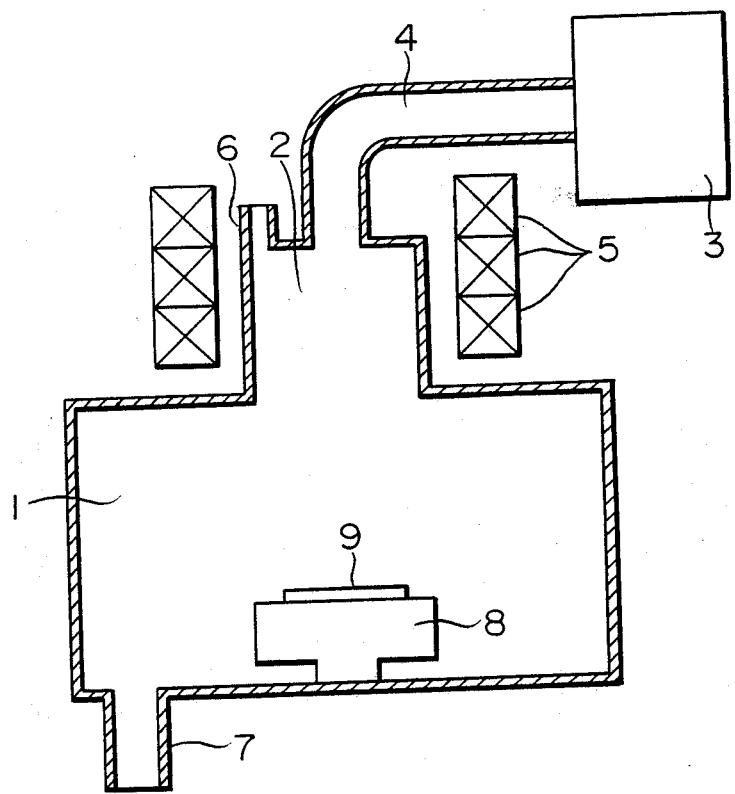
FIG. 1 is a schematic elevational sectional view of a device for treating semiconductor wafers utilizing a plasma produced by electron cyclotron resonance according to the present invention.

Referring now to FIG. 1 of the drawings, the first embodiment according to the present invention is described.

The ECR plasma wafer treating device shown in FIG. 1 comprises a cylindrical wafer treating chamber 1, on the floor of which a support table 8 for a semiconductor wafer 9 is disposed. A cylindrical plasma generating chamber 2 is disposed coaxially on top of the wafer treating chamber 1, the cylindrical space in the plasma generating chamber 2 forming an upwardly projecting continuation of the cylindrical space in the wafer treating chamber 1. A microwave source 3, i.e. a magnetron, generates microwaves with a frequency of not more than 2 GHz and not less than 100 MHz. The source 3 may be of a variable or a fixed frequency type. In either case, the frequency of the microwaves generated by the source 3 is selected based on the dimensions of the chambers 1 and 2 and the wafer 9, or the velocity of the electrons in the plasma generating chamber 2, so that the Larmor radius of the electrons moving in helical paths in electron cyclotron resonance in the plasma generating chamber 2 is optimized. The source 3 is coupled to the plasma generating chamber 2 via a waveguide 4 and a quartz plate 2a which forms a partition between the guide 4 and the chamber 2. Alternatively, the source 3 may be coupled to the chamber 2 via a coaxial cable in cases where the frequency of the microwave generated by the source 3 is sufficiently low to warrant the usage thereof as a transmission line for the microwave energy. A solenoidal electromagnetic coil 5 surrounds the plasma generating chamber 2 to produce a magnetic field in the plasma generating chamber 2 and the wafer treating chamber 1, as will be explained in more detail hereinbelow. The flux density of the magnetic field in the plasma generating chamber 2 is regulated to a value at which electron cyclotron resonance is produced in cooperation with the microwave energy. A gas introducing port 6 is formed in the ceiling of the plasma generating chamber 2 and a gas exhausting port 7 is formed in the floor of the wafer treating chamber 1.

The treatment of the wafer 1b, e.g. polycrystalline silicon etching is effected as follows.

First, after the gas remaining in the chambers 1 and 2 is thoroughly exhausted from the gas exhausting port 7, a reactive gas such as $Cl_2$ is introduced through the port 6, a part of the gas being exhausted from the port 7 to keep the pressure in the chambers 1 and 2 at a predetermined level. Then, the microwave source 3 is energized to supply microwaves at a frequency of 0.5 GHz to the plasma generating chamber 2 through the wave guide 4. Simultaneously, the coil 5 is energized to produce a magnetic field in the plasma generating chamber 2 and the wafer treating chamber 1. The flux density of the magnetic field in the plasma generating chamber 2 is regulated to 179 G, so that electron cyclotron resonance is produced and the electrons in the plasma generating chamber 2 are accelerated in helical paths absorbing energy from the microwaves in electron cyclotron resonance. Thus, due to the collisions of the high speed electrons, a dense plasma of $Cl_2$ is formed in the chamber 2. The magnetic field formed by the coil 5 diverges from the plasma generating chamber 2 to the semiconductor wafer support table 8. Thus, the gas of magnetic force formed by the coil 5 in the chamber 1 to the wafer 9 on the support table 8. As a result, the polycrystalline silicon etching is effected on the surface of the wafer 9. Thanks to the optimization of the Larmor radius of the electrons in electron cyclotron resonance, the plasma is generated with a uniform density in the plasma generating chamber 2. Thus, the amount of the reactive ions arriving at the surface of the wafer 9 is made uniform over the whole surface of the wafer 9, which results in higher uniformity of the treatment thereof.

Figure 2:
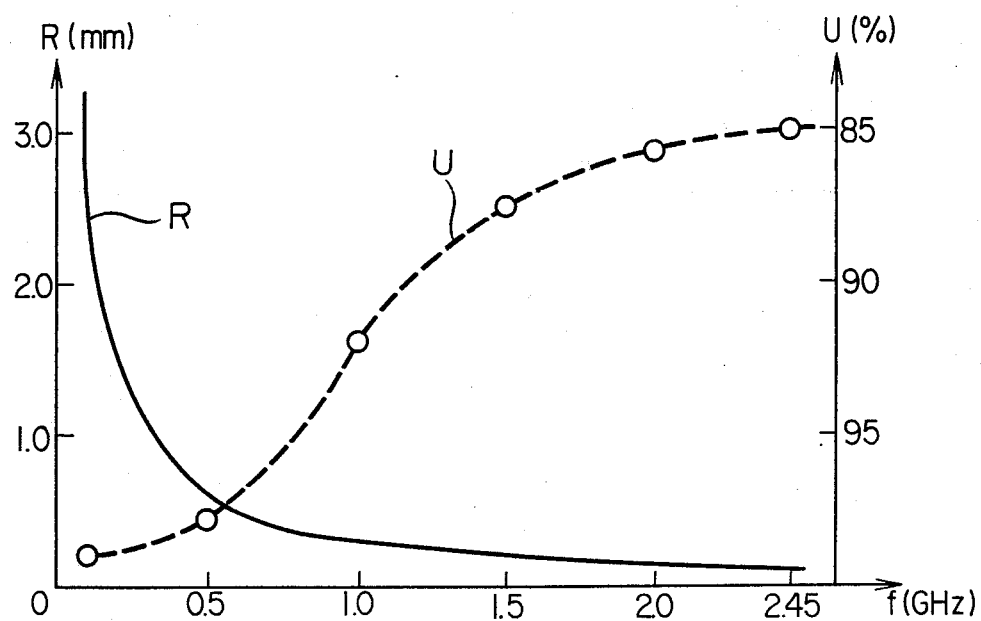
FIG. 2 shows the relationships between (i) the frequency of microwave energy and the Larmor radius of electrons moving in helical paths in the plasma generating chamber and (ii) the frequency of microwave energy and the uniformity of the wafer treatment.

The parameters of the device shown in FIG. 1 are as follows:
diameter of the plasma generating chamber: 300 mm
diameter of the wafer: 150 mm
frequency of the microwave source: 0.5 GHz
output power of the microwave source: 600 W
flux density of the magnetic field in the plasma generating chamber: 179 G
gas pressure: 1 m Torr
Larmor radius of electrons (based on the assumption that the kinetic energy of the electrons is 10 eV) : 0.6 mm As described above, the frequency of the microwaves generated by the source 3 is chosen according to the present invention at the value at which the Larmor radius of the electrons moving in helical paths in electron cyclotron resonance in the plasma generating chamber 2 is optimized to enhance the uniformity of the treatment of the wafer 9. FIG. 2 shows, in solid line, the relationship between the microwave frequency f and the Larmor radius R of electrons in the case where the kinetic energy of electrons is 10 eV. The dotted line in the same figure shows the relationship between the microwave frequency f and the uniformity index u of the wafer treatment over the surface thereof, wherein the uniformity index u (%) is expressed as follows:

$$u = \{1-(Lmax-Lmin/Lmax+Lmin)\} \times 100\%$$

where Lmax is the maximum etching depth or film thickness on the surface of the wafer, and Lmin is the minimum etching depth or film thickness. The value of 100% of u represents complete uniformity of the treatment. As is seen from the figure, the uniformity index u, which is 85% at the conventional microwave frequency of 2.45 GHz, increases to above 86% as the microwave frequency f decreases under 2.0 GHz. When the microwave frequency f is under 1.0 GHz, the uniformity index u goes up above 92%. When the microwave frequency f is under 0.5 GHz, the uniformity index u exceeds 97%. At the extreme lower limit frequency of 100 MHz, the uniformity index u improves to 99%. The Larmor radius R of the electrons at the microwave frequency of 100 MHz, on the other hand, is 2.4 mm, which practically limits the lowest value of the microwave frequency f which can be adopted in the device according to the present invention.

What is claimed is:

1. A device for treating semiconductor wafers utilizing a plasma generated electron cyclotron resonance comprising:
   a first chamber accommodating support means for supporting a semiconductor wafer;
   a second chamber disposed adjacent to and in communication with said first chamber;
   gas supplying means for supplying a gas into said second chamber;
   means coupled to said second chamber for supplying microwave energy having a frequency greater than 100 MHz and less than 2 GHz to said second chamber; and
   electromagnetic means surrounding said second chamber for forming a magnetic field in said second chamber for producing an electron cyclotron resonance plasma in said second chamber and for forming a magnetic field in said first chamber diverging in a direction from said second chamber to said support means for transporting a plasma generated in said second chamber to the semiconductor wafer supported by said support means.

2. A device for treating semiconductor wafers as claimed in claim 1 wherein the frequency of the microwave energy supplied by said microwave supplying means is not more than 1.0 GHz.

3. A device for treating semiconductor wafers as claimed in claim 1 wherein the frequency of the microwave energy supplied by said microwave supplying means is not more than 0.5 GHz.

4. A method of treating a semiconductor wafer with a plasma comprising:

disposing a semiconductor wafer in a first chamber, the first chamber being in communication with a second chamber;

supplying a gas to the second chamber;

maintaining a subatmospheric pressure in the first and second chambers;

establishing a magnetic field in the first chamber diverging from the second chamber toward the wafer in the first chamber;

supplying microwave energy to the second chamber having a frequency greater than 100 MHz and less than 2 GHz to establish a plasma in the second chamber; and establishing a magnetic field in the second chamber having a flux density producing electron cyclotron resonance in the plasma whereby the wafer is relatively uniformly treated over its exposed surface.

5. The method of claim 4 including supplying microwave energy having a frequency of not more than 1 GHz.

6. The method of claim 4 including supplying microwave energy having a frequency of not more than 0.5 GHz.

* * * * *